(12) United States Patent
Thovex et al.

(10) Patent No.: US 8,724,078 B2
(45) Date of Patent: May 13, 2014

(54) DEVICE AND METHOD FOR DRYING A PHOTOMASK

(75) Inventors: Cindy Thovex, La Clusaz (FR); Bertrand Bellet, Chambery (FR)

(73) Assignee: Adixen Vacuum Products, Annecy (FR)

( * ) Notice: Subject to any disclaimer, the term of this patent is extended or adjusted under 35 U.S.C. 154(b) by 0 days.

(21) Appl. No.: 13/805,155

(22) PCT Filed: Jun. 27, 2011

(86) PCT No.: PCT/EP2011/060750
§ 371 (c)(1),
(2), (4) Date: Dec. 18, 2012

(87) PCT Pub. No.: WO2012/000951
PCT Pub. Date: Jan. 5, 2012

(65) Prior Publication Data
US 2013/0094007 A1    Apr. 18, 2013

(30) Foreign Application Priority Data

Jun. 30, 2010 (FR) ...................... 10 02765

(51) Int. Cl.
*F26B 3/34* (2006.01)
*G03B 27/52* (2006.01)
*G03F 1/00* (2012.01)

(52) U.S. Cl.
USPC ...................... 355/30; 34/266; 34/267; 430/5

(58) Field of Classification Search
CPC ... G03F 1/82; G03F 7/70908; G03F 7/70916; G03F 7/70925
USPC ........... 34/266, 267, 273, 274; 134/1; 355/30, 355/75; 430/5
See application file for complete search history.

(56) References Cited

U.S. PATENT DOCUMENTS

2007/0187272 A1    8/2007    Bonness et al.

FOREIGN PATENT DOCUMENTS

| EP | 1 832 353 A2 | 9/2004 |
| EP | 1 925 909 A1 | 5/2008 |
| WO | WO 2009/112655 A1 | 9/2009 |

OTHER PUBLICATIONS

PCT Search Report of the ISA for PCT/EP2011/060750 dated Sep. 14, 2011.

(Continued)

*Primary Examiner* — Toan Ton
*Assistant Examiner* — Colin Kreutzer
(74) *Attorney, Agent, or Firm* — Daly, Crowley, Mofford & Durkee, LLP

(57) ABSTRACT

An object of the present invention is a photomask drying device which includes: a sealed chamber containing at least one photomask, a pumping unit to set up and maintain vacuum within said chamber, a support for the photomask placed within said chamber, infrared radiation means placed within said chamber, a system for injecting gas into said chamber characterized in that the infrared radiation means comprise a plurality of infrared radiation sources distributed in a plane parallel to the plane of the photomask in such a way that the distance from the photomask to the infrared radiation means is given by the relationship: $D=1.5 \times d$ wherein D is the distance between the plane containing the infrared radiation sources and the photomask and d is the distance between the center points of two neighboring infrared radiation sources, and in that the gas injection system comprises a plurality of gas injectors distributed in a plane parallel to the plane of the photomask in such a way that the injectors follow a 90° rotational invariance about the center point of the photomask.

10 Claims, 4 Drawing Sheets

(56) References Cited

OTHER PUBLICATIONS

International Preliminary Report on Patentability for PCT/EP2011/060750 dated Jan. 8, 2013.

Written Opinion of the ISA for PCT/EP2011/060750 dated Sep. 14, 2011.

French Search Report and Written Opinion of the ISA for F1002765 dated Feb. 1, 2011.

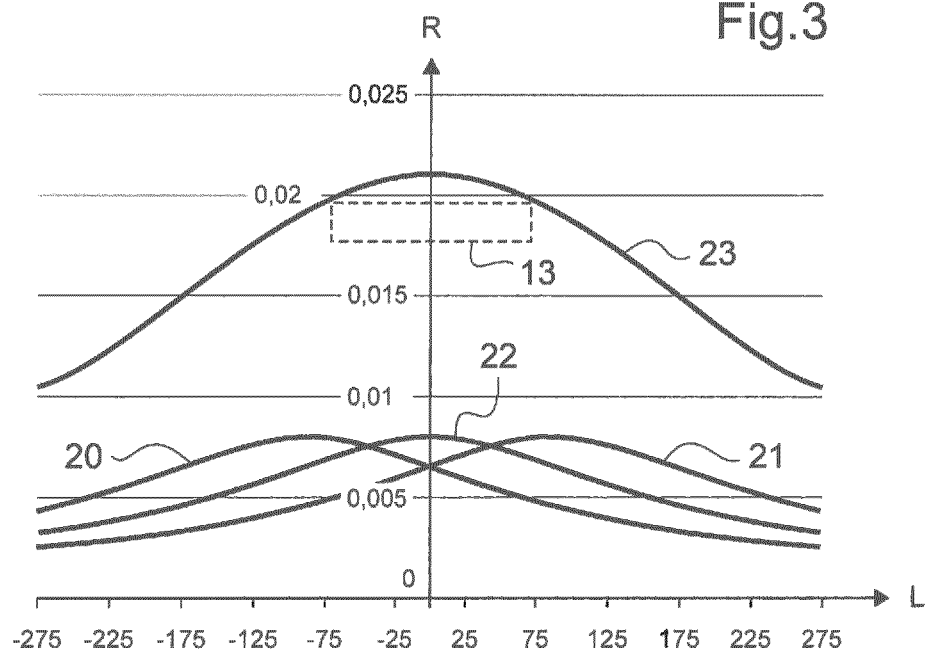
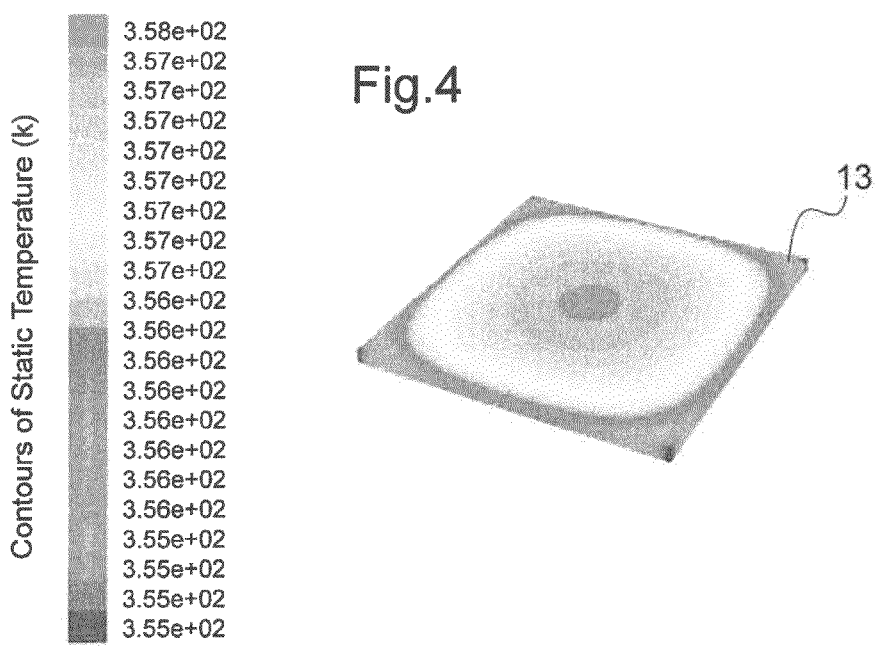

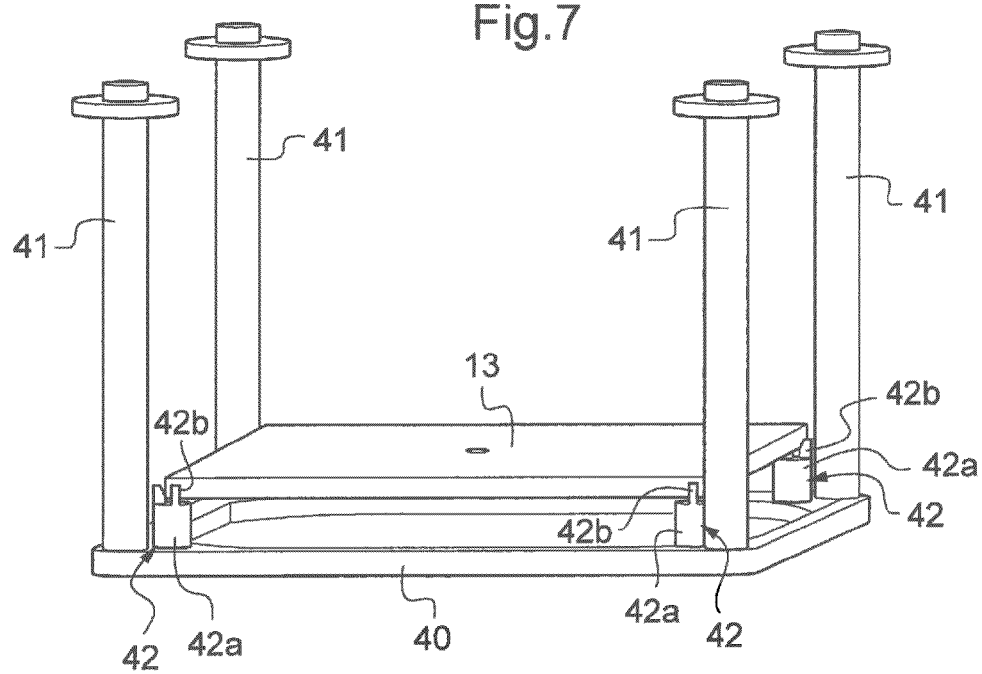
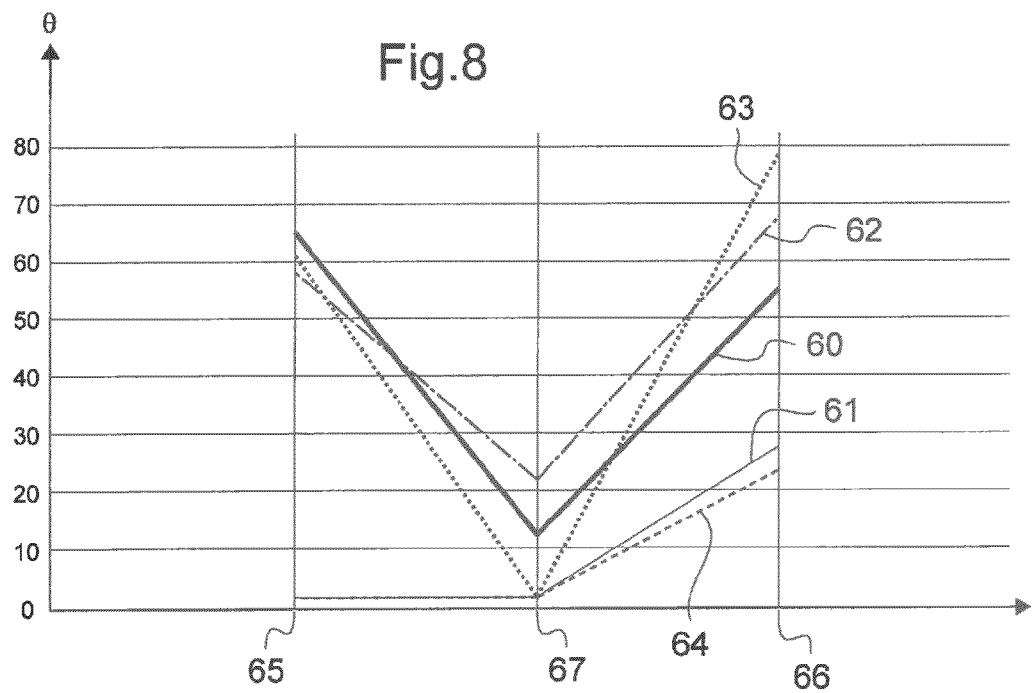

US 8,724,078 B2

DEVICE AND METHOD FOR DRYING A PHOTOMASK

CROSS REFERENCE TO RELATED APPLICATIONS

This application is a National Stage application of PCT/EP2011/060750 filed on Jun. 27, 2011 and published in the French language, and entitled "DEVICE AND METHOD FOR DRYING A PHOTOMASK" which claims priority to French application FR1002765 filed on Jun. 30, 2010.

BACKGROUND OF THE INVENTION

The present invention pertains to a photomask drying device used especially in the manufacture of submicron-sized microelectronic components. It can furthermore be extended to the method for drying the photomask.

The micromachining of semi-conductor substrates, especially made of silicon, is currently being done by a plasma-etching techniques used to etch a pattern transferred to the substrate from a photomask by a lithography method. A photomask is equivalent to a negative in photography; it contains a piece of information to be printed on a medium. The pollution in the active zone of the photomask has a direct effect on the image printed on the substrate in that a defect is printed.

Moreover, the semiconductor industry is seeking to reduce the size of the recorded image in order to obtain ever smaller, increasingly integratable and ever less costly electronic components. With the dimensions of a photomask getting smaller, the requirements in terms of pollution are becoming increasingly stringent, in order to enable the etching of patterns with dimensions smaller than 100 nm, the wavelength of the lithography laser has gone from 193 nm in the prior-art technique to 13.5 nm in the more recent technique known as the EUV (extreme ultra-violet) technique. The photomask is therefore a vital, costly and complex element that has to be kept clean and operational.

At the end of its manufacture, the photomask is cleaned. For a photomask used in classic techniques, a film is then applied to the photomask in order to protect its active face from any particles. The final cleaning step is done in a wet medium. Following the cleaning step, the photomask has to be carefully dried in order to eliminate all residues of adsorbed humidity. Today, if is by applying heat at very high temperatures (of the order 80-90° C.) that humidify is usually eliminated. This is a mode of drying that acts essentially on the surface.

An EUV photomask designed to be used in the EUV technique carries no film. If is a fiat element formed by a "multi-layered" type of stacking formed by very fine layers of different materials (MoSi, TaN etc) deposited on a quartz base. It cannot be exposed to a temperature of over 60° C. or to a temperature variation of more than 10° C. on its active surface because an excessively high temperature or excessively steep temperature gradient would lead to an excessively great expansion of certain layers, and the EUV photomask would thereby deteriorate.

The efficiency of the drying is generally assessed by measuring the angle of contact θ of a drop of liquid on the surface of the photomask. A drop is deposited on a solid surface. It spreads out until an equilibrium of forces is attained between the different phases present (solid, liquid and vapor). The relationship between these different forces and the angle of contact is given by Young's equation:

$$\gamma_{SV} = \gamma_{LV} \cos\theta + \gamma_{SL}$$

wherein:
$\gamma_{SV}$ is the interfacial tension between solid and vapor,
$\gamma_{LV}$ is the interfacial tension between liquid and vapor,
$\gamma_{SL}$ is the interfacial tension between solid and liquid, and
θ is the value of the angle of contact between a drop of liquid and the surface of the photomask.

The hydrophilic or hydrophobic character of the surface of a photomask depends on the material that constitutes it, and is measured by the angle of contact θ. Once the surface of the photomask is truly dry, it becomes hydrophobic, the spread of the drop is limited and the angle of contact is big. In order that the surface of a photomask may be considered to be sufficiently hydrophobic, the angle of contact θ must be greater than 55° for chromium, 25° for quartz, 80° for ruthenium and 70° for tantalum nitride. Now, the methods that use heating, such as the ones currently used, cannot achieve this degree of efficiency while remaining at moderate temperatures.

The need is being felt for a drying method that meets both the constraints related to the EUV photomask itself and the constraints related to already existing equipment and manufacturing conditions. However, the drying obtained by this method must be equally efficient or even more efficient than that obtained by known methods. The drying step must enable a homogenous drying in volume of the EUV photomask without causing its deterioration, especially because of the temperature, and without disturbing the manufacturing process. Thus, the EUV photomask has to be dried within a maximum time of 20 minutes. This corresponds to the time available in the manufacturing flow. At the end of the drying step, the EUV photomask should be at a temperature of the order of 30° C. to 35° C.

It is also an aim of the present invention to propose a method for drying an EUV photomask that is to be used in the EUV technique, is film-free, and for which the drying temperature must not exceed 60° C.

It is yet another aim of the invention to propose a device for ensuring the homogeneity of the temperature throughout the surface of the EUV photomask. Indeed, the temperature has to be controlled with high precision because the temperature on the surface of the EUV photomask should be kept constant and uniform with a maximum variation of ±5° C. throughout the duration of the drying stop.

SUMMARY OF THE INVENTION

The object of the present invention is a device for drying a photomask comprising:
  a sealed chamber containing at least one photomask,
  a pumping unit to set up and maintain vacuum within said chamber,
  a support for the photomask placed within said chamber,
  infrared radiation means placed within said chamber,
  a system for injecting gas into said chamber.

The infrared radiation means comprise a plurality of infrared radiation sources distributed in a plane parallel to the plane of the photomask in such a way that the distance from the photomask to the IR radiation means is given by the relationship:

$$D = 1.5 \times d$$

wherein D is the distance between the plane containing the infrared radiation sources and the photomask and d is the distance between the center points of two neighboring infrared radiation sources, and the gas-injection system comprises a plurality of gas injectors distributed in a plane parallel to the plane of the photomask in such a way that the injectors follow a 90° rotational invariance about the center point of the photomask.

Preferably, the infrared radiation sources are placed so as to send infrared radiation perpendicularly to the active surface of the photomask.

According to a first embodiment, the drying device comprises at least three infrared radiation sources aligned so that two IR radiation sources are placed respectively on either side of the photomask and one infrared radiation source at least is placed at the center of the photomask.

The diameter of the gas-injection orifice, placed so as to be facing the center of the photomask, is for example greater than the diameter of the other orifices.

According to a second embodiment, the drying device includes temperature-measuring means provided with pyrometers, placed so as to measure the temperature on the edge of the photomask.

According to a third embodiment, the drying device comprises a support of the photomask comprising means for receiving and positioning the photomask, comprising a pierced frame suspended inside the sealed chamber.

According to a fourth embodiment, the device comprises remote ultrasonic sensors.

According to a fifth embodiment, the drying device comprises means for measuring pressure, temperature and distance and a control and command device capable of receiving information from the means for measuring pressure, temperature and distance and capable of driving the infrared radiation means and the gas-injection system as a function of the information received.

Another object of the invention is a method for drying a photomask by means of the above drying device, comprising the following steps:
the photomask is positioned in a sealed chamber at atmospheric pressure,
the photomask is heated to a fixed temperature equal at most to 60° C.,
a low pressure is set up in the sealed chamber by the pumping out of the gases that it contains,
the chamber is kept at low pressure and at the fixed temperature for a fixed duration,
the heating of the photomask is stopped,
atmospheric pressure is restored in the chamber by injection of a neutral gas, and
if is ascertained that the temperature of the photomask is about 30°-35° C. before the photomask is extracted from the chamber.

According to one variant, the positioning of the photomask is verified by means of at least three remote ultrasonic sensors.

Naturally, the drying device and method according to the invention can also be used to dry photomasks used in classic techniques, before application of the film.

BRIEF DESCRIPTION OF THE DRAWINGS

Other features and advantages of the present invention shall appear from the following description of one embodiment, given naturally by way of a non-exhaustive, illustratory example, and from the appended drawings of which:

FIG. 3 shows the spatial position of the radiation emitted by the infrared radiation sources and the resulting radiation received by the EUV photomask: the radiation R in W/mm$^2$ is given on the x-axis and the distance L in millimeters from the center of the EUV photomask is given on the x-axis, FIG. 4 is a view of the distribution of temperature on the surface of a photomask after the photomask has received the radiation resulting from the infrared radiation sources, FIG. 7 shows an embodiment of a means for receiving and positioning the EUV photomask, and FIG. 8 shows the progress of the value of the angle of contact of a drop of liquid on the surface of the EUV photomask as and when the cleaning of this mask progresses; the angle of contact θ is given on the y-axis and the progress of the cleaning operations is given on the x-axis.

MORE DETAILED DESCRIPTION

Figure 1:
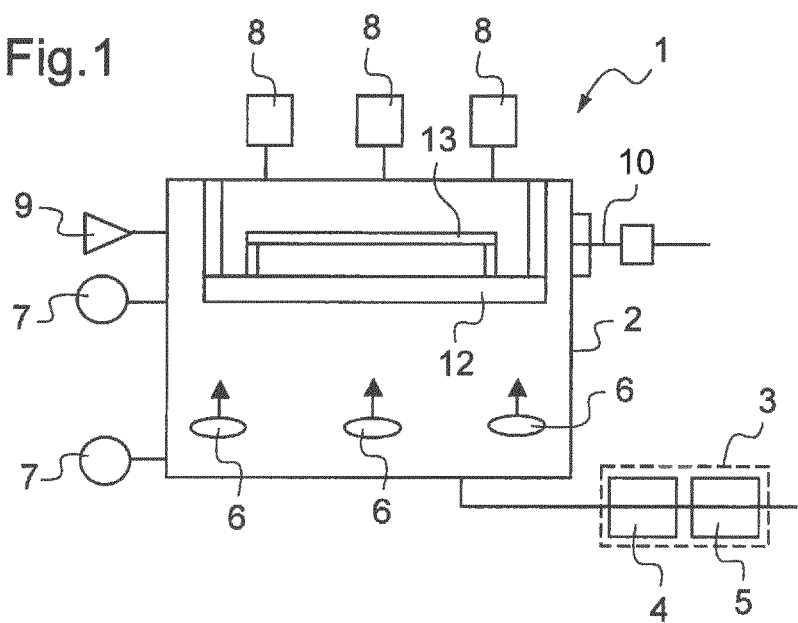
FIG. 1 is a schematic view of the different means included in the device for drying an EUV photomask.

The device 1 used to dry an EUV photomask is represented schematically in FIG. 1. The device 1 is to be integrated into a photomask cleaning apparatus.

The device 1 has a sealed chamber 2 capable of receiving an EUV photomask, a pumping unit 3 comprising for example a primary pump 5 and a secondary pump 4, infrared radiation means comprising a plurality of infrared radiation sources 6 placed in the lower part of the chamber 2, pressure sensors 7, remote ultrasonic sensors 8 placed in the upper part of the chamber 2 and at least one pyrometer 9, a gas-injection system composing a gas-injection line, a blow-off value or pressure-relief valve to prevent a rise in pressure in the chamber 2, and a photomask support 12.

The temperature of the EUV photomask is controlled during the drying step by means of at least one pyrometer 9 aimed at the edge of the photomask 13, preferably as close as possible to the center. To finalize the system for controlling and periodically checking the pyrometer, a calibration curve is plotted for the full range of temperatures. The mean temperature of the EUV photomask is computed from the data given by a plurality of temperature sensors, preferably at least nine sensors, measuring the temperature at different points of the surface of the EUV photomask.

Remote ultrasonic sensors 8, preferably three in number, are positioned in the lower part of the chamber. The remote ultrasonic sensors 8 measure the distance between them and the photomask 13 at several points of its surface. The remote ultrasonic sensors 8 are used to detect whether an EUV photomask has been introduced into the chamber 2, determine the size of this mask and validate its correct positioning in the chamber 2, especially as regards the horizontally, or attitude, of the EUV photomask.

Figure 2:
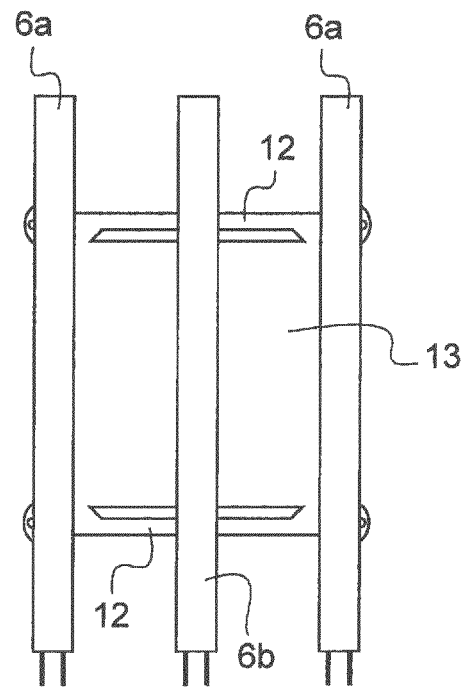
FIG. 2 is a schematic bottom view showing the position of the infrared radiation sources relatively to the EUV photomask.

Infrared radiation sources 6, such as infrared lamps, are used to dry the EUV photomasks. The invention chooses for example infrared radiation sources 6 that are identical and whose number, mutual spacing and distance from the photomask 13 have been chosen in such a way that the heating is appreciably uniform on the surface of the photomask 13 as shown in FIGS. 2 and 3.

The infrared radiation sources 6 are placed in the lower pad of the chamber 2 on the active face side of the EUV photomask 13, in a plane parallel to the surface of the EUV photomask 13 so as to send the infrared radiation perpendicularly directly on to the active face of the EUV photomasks 13. The infrared radiation sources 6 are at least three in number. Two of them 6a are positioned towards the ends of the chamber, so that they are placed on either side of the photomask 13. The other source or sources of infrared radiation 6b are positioned at the center of the chamber so as to correspond substantially to the center of the photomasks 13. In this example, the three infrared radiation sources 6 are away from one another by a distance d which is equal to 83 mm. The radiation sources 6a, 6b are positioned in a plane that is distant from the surface of the photomask 13 by a distance D which herein is equal to: D=1.5×d, giving 125 mm.

This positioning makes it possible to have an overlapping of the radiant spectra of all the infrared lamps 6, thus favoring a uniform heating throughout the surface of the photomask 13. FIG. 3 shows the value of the radiation R in $W/mm^2$ as a function of the distance L in millimeters from the center of the photomask 13. The infrared radiation sources placed on either side of the photomask emit a radiation 20 and 21 respectively and the infrared radiation source positioned between them, at the center, sends out a radiation 22. The addition of these radiation values 20, 21 and 22 results in a radiation 23. The figure shows the position of a photomask 13 (shown in dashes), with a side measuring 2 L=150 mm, receiving the resultant radiation 23. The center of the photomask 13 is at the point L=0 and the photomask 13 therefore occupies the position from L=−75 to L=+75. It can be seen that the surface of the photomask 13 thus receives a radiation 23 whose uniformity is substantially improved, for example as compared with the radiation received from the single source 6 placed at the center. FIG. 4 illustrates an example of distribution of the temperature obtained on the surface of the photomask 13. In view of the substantially flat configuration of the photomask, the temperature gradient at the edge of the photomask 13 is negligible. It can be seen in this example that the distribution of temperature is substantially bell-shaped with a zone at the center of the photomask that is appreciably hotter than the peripheral zones which are themselves appreciably hotter than the zones at the edge of the photomask 13. However, the arrangement of the infrared radiation sources 6 relatively to the photomask 13 gives a temperature gradient on the surface of the photomask that is acceptable, i.e. less than 10° C. on the active surface of the mask.

Figure 5:
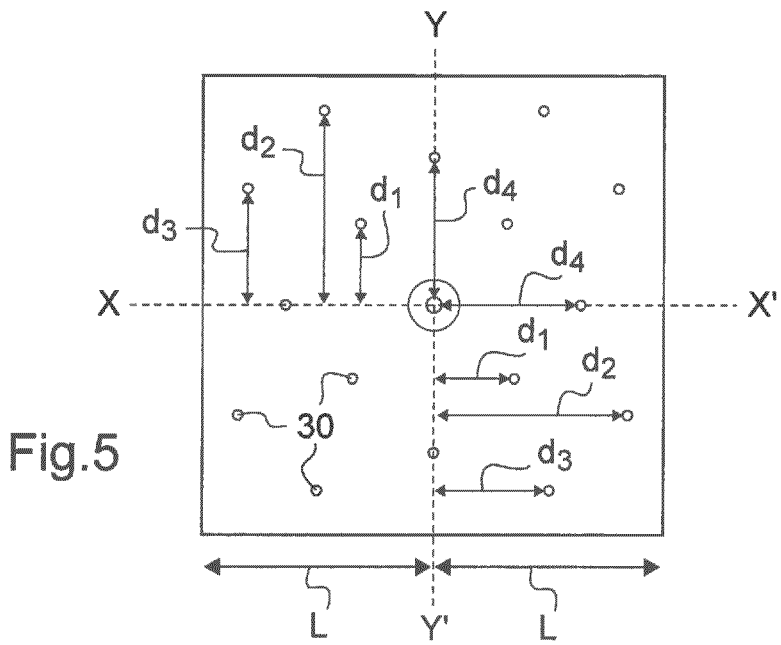
FIG. 5 is a schematic top view showing the position of the gas injectors relatively to the EUV photomask.
Figure 6:
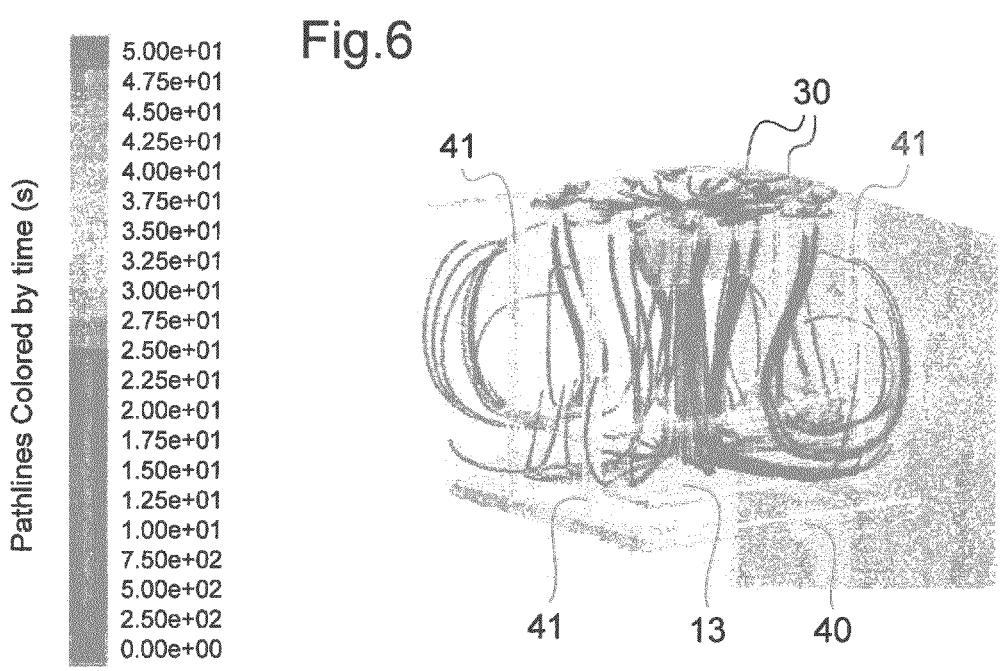
FIG. 6 is a view in perspective of the circulation of the gas injected by the gas-injection system.

Heating the photomask by infrared radiation means and subjecting it to pressure below atmospheric pressure by means of the pumping unit 3, for example pressure of the order of $10^{-5}$ mbars, encourages the gases present in the material to get diffused towards the surface and hence encourages the de-gassing of these materials under vacuum. The drying unit therefore enables homogenous drying in volume without the deterioration of the photomask. FIGS. 5 and 6 represent an embodiment of the gas-injection system 10 comprising a plurality of injectors 30 of gas, for example nitrogen or helium, placed in the upper pad of the chamber 2 so as to send a stream of gas on to the face opposite to the active face of the photomask 13. The gas-injection system 10 comprises a plurality of gas injectors 30 distributed in a plane parallel to the plane of the photomask 13 in such a way that the injectors 30 follow a 90° rotational invariance about a point coinciding with a point facing the center of the photomask 13. The photomask 13 is a square with a side measuring 2 L=150 mm. The injectors 30 are placed at a distance $d_1$, $d_2$, and $d_3$ respectively from the perpendicular axes X-X' and Y-Y', passing through the center of the photomask 13 and the middle of its sides and at a distance $d_4$ on these axes X-X' and Y-Y'. In the present case, these distances are equal for example to: $d_1$=25 mm, $d_2$=62.5 mm, $d_3$=37.5 mm and $d_4$=50 mm. The projections of these distances $d_1$, $d_2$, $d_3$ and $d_4$ on the axes X-X' and Y-Y' are equidistant.

Once the infrared radiation means have been stopped and the pumping unit 23 isolated in the chamber 2, the photomask 13 gets cooled down by radiative and convective exchange between the external surfaces and its environment. Gas is then sent by the gas injectors 30, thus accelerating the cooling by forced convection as can be seen in FIG. 6 representing the circulation of the injected gas. However, the particular arrangement of the gas injectors 30 makes if possible to cool down the surface of the photomask 13 as a function of the temperature distribution resulting from the layout of the infrared radiation sources. If can be seen that with this distribution of the gas injectors 30, the gas used (helium or nitrogen) gets oriented firstly towards the center of the photomask 13, then extends symmetrically on the surface of the photomask and then rises along the walls of the chamber. The layout of the injectors in the chamber facing the photomask is therefore complementary to the layout of the infrared radiation sources to compensate for the "bell-shaped" temperature distribution, i.e. in cooling the center of the photomask to a greater extent. Thus, the injection of gas does not accentuate the temperature gradient present on the surface of the photomask but keeps it at less than 10° C. on the active surface of the photomask 13.

To further accentuate the cooling at the center of the photomask, if can furthermore be planned that the diameter of the gas-injection orifice placed so as to be facing the center of the photomask will be greater than the diameter of the other injection orifices. For example, the diameter of the gas-injection orifice placed so as to be facing the center of the photomask is about double the diameter of the other injection entices. There are thus for example 17 gas injectors 30 available for three infrared radiation sources 6.

One embodiment of the support 12 of the photomask of the drying device, comprising means for receiving and positioning the photomask 13, is shown in FIGS. 6 and 7. These means include a pieced frame 40, with a size matching the size of the photomask 13 which it must receive, suspended within the chamber 2 by four columns 41. The infrared radiation sources 6 may thus radiate towards the active face of the EUV photomask 13 without any obstacle to the radiation by the frame 40. Furthermore, the means for receiving and positioning the photomask, in the form of a pierced frame, encourage the cooling of the photomask by radiative and convective exchange and limit heat transfer by conduction so as to achieve full control over the homogeneity of the cooling.

The columns 41 are fixed firstly to the upper part of the chamber 2 and secondly to the four corners of the frame 40. Four pins 42 borne by the frame 40 have the function of receiving and accurately positioning the photomask 13. These pins 42 consist of two parts: a first part 42a, for example made of stainless steel or ceramic, enabling the frame 40 to be connected, end a second part 42b, consisting of two reception tabs, made of gold for example, on which the photomask 13 will rest. Should the connection part 42a be made of ceramic, the tabs 42b are connected to the ground of the chamber 2 so as to enable the photomask 13 to discharge its static electricity because, during the drying, the photomask 13 gets electrostatically charged.

If necessary, the drying device may comprise several supports, each provided with a differently sized pierced frame, laid out in such a way that the smallest-sized frame will be placed on top.

Furthermore, a control and command device receives information from the means for measuring pressure, temperature and distance and deduces instructions therefrom to make the infrared radiation means and the gas-injection system operate as a function of the information received. The control and command device is also capable of communicating with the apparatus for cleaning the photomasks and with the robot for making transfers between the cleaning equipment and the photomask-drying device.

The cleaning method comprises a drying step including the following operations: the photomask 13 is conveyed from the cleaning apparatus up to the chamber 2 of the drying device 1 by a robot which deposits the photomasks 13 on the pierced frame 40. The transfer valve closes up.

A check is made on the positioning of the photomask 13 by means of the remote ultrasonic sensors 8, herein three sensors for example. If the measurements given by the ultrasonic sensors 8 are identical, the correct horizontal positioning of the photomask is validated. The measured value is then stored in the control and command device.

The heating starts at atmospheric pressure. The progress of the temperature is measured in real time by means of the pyrometer 9. The uniformity of the heating of the photomasks is ensured through intermittent heating which alternates between infrared source 6 lighting periods, which could be for example one-second periods, and extinguishing periods, for example two-second periods. As soon as the photomask 13 reaches a fixed temperature below or equal to 60° C., the pumping unit 3 is put into operation to pump out the chamber 2. The use of a primary pump 5 and a secondary pump 4 connected in series boosts the vacuum up to $10^{-5}$ mbar. The secondary vacuum thus attained provides for a more efficient desorption of the photomask 13. The photomask 13 is maintained at a temperature close to 60° C. for about 10 minutes.

Then, the infrared radiation means are stopped and the pumping unit 3 of the chamber 2 is isolated. The rise in pressure in the chamber 2 is then achieved by injection of a flew of neutral gas, for example nitrogen. The gas-injection system preferably takes the form of a plurality of injectors 30 positioned as can be seen in FIG. 4 or else constituted by nozzles so as to prevent the generation of particles. The gas-injection system is placed above the photomask 13 and enables injection at several points so as to provide for a homogenous distribution of the gas stream on the surface of the photomask 13. The injected gas thus cools the photomask 13 and provides for the rise in pressure. Furthermore, the layout of the infrared means and of the system for injecting a gas stream makes the temperature uniform on the active surface of the photomask with a temperature difference on the active surface that is less than 10° C. When the pressure reaches atmospheric pressure, the injection of nitrogen is replaced by an injection of helium which is more efficient from the cooling point of view. When the temperature of the photomask 13 reaches about 30° C. to 35° C., the cooling is stopped and the photomask 13 can be withdrawn from the chamber 2. There is a wait for the temperature of the photomask 13 to reach about 30° C. to 35° C. before the photomask 13 is extracted from the chamber, so that the photomask 13 is at a temperature close to ambient temperature in order to prevent the re-adsorption of the gases present in the atmosphere which could take place during the drop in temperature.

FIG. 8 shows the efficiency of the drying obtained by the method according to the invention. The measurements of the contact angle θ have been made on surfaces constituted by chromium 60 (Cr), quartz 61, ruthenium 62 (Ru) and tantalum nitride 63 (TaN) or silicon molybdenide 64 (MoSi). It is noted that the angle of contact θ measured after the drying step 66 is of the same order of magnitude or even better than that measured with the cleaning operation 65 on all the materials tested. The angle of contact θ measured after the drying step 66 must be compared with the value of the contact angle θ measured before the drying step 67.

Naturally, the present invention is not limited to the embodiments described but can have many variants accessible to those skilled in the art without any departure from the spirit of the invention.

The invention claimed is:

1. A device for drying a photomask, the device comprising:
 a sealed chamber having a size and shape configured to receive at least one photomask,
 a pumping unit to set up and maintain vacuum within said chamber,
 a support for the photomask placed within said chamber,
 infrared radiation means placed within said chamber,
 a system for injecting gas into said chamber,
 characterized in that the infrared radiation means comprises a plurality of infrared radiation sources distributed in a plane parallel to the plane of the photomask in such a way that the distance from the photomask to the infrared radiation means is given by the relationship:

$$D = 1.5 \times d$$

wherein:
 D is the distance between a plane containing the infrared radiation sources and the photomask; and
 d is a distance between the center points of two neighboring infrared radiation sources, and
 the gas-injection system comprises a plurality of gas injectors distributed in a plane parallel to the plane of the photomask in such a way that the injectors follow a 90° rotational invariance about the center point of the photomask.

2. The drying device according to claim 1, wherein the infrared radiation sources are placed so as to send infrared radiation in a direction which is perpendicular to an active surface of the photomask.

3. The drying device according to claim 1, further comprising at least three infrared radiation sources aligned so that two infrared radiation sources are placed respectively on either side of the photomask and one infrared radiation source at least is placed at the center of the photomask.

4. The drying device according to claim 3, wherein the diameter of the gas-injection orifice, placed so as to be facing the center of the photomask, is greater than the diameter of the other orifices.

5. The drying device according to claim 1, further comprising temperature measuring means provided with pyrometers, placed so as to measure the temperature on the edge of the photomask.

6. The drying device according to claim 1 wherein the support for the photomask comprises means for receiving and positioning the photomask, said means comprising a pierced frame suspended inside said chamber.

7. The drying device according to claim 1 further comprising remote ultrasonic sensors.

8. The drying device according to claim 1 further comprising means for measuring pressure, temperature and distance and a control and command device capable of receiving information from the means for measuring pressure, temperature and distance and capable of making the infrared radiation means and the gas-injection system operate as a function of the information received.

9. A method for drying a photomask, the method comprising:
 positioning a photomask in a sealed chamber having a size and shape configured to receive at least one photomask, wherein the photomask is disposed on a support placed within the chamber at atmospheric pressure;
 establishing a vacuum within the sealed chamber using a pumping unit to set up and maintain the vacuum within the sealed chamber wherein establishing a vacuum is accomplished by establishing a low pressure in the sealed chamber by pumping out gases contained in the chamber using the pumping unit;

injecting gas into the sealed chamber using a system for injecting gas, wherein the gas-injection system includes a plurality of gas injectors distributed in a plane parallel to the plane of the photomask in such a way that the injectors follow a 90° rotational invariance about the center point of the photomask; and heating the photomask to a fixed temperature equal at most to 60° C. using infrared radiation means placed within the sealed chamber, characterized in that the infrared radiation means comprises a plurality of infrared radiation sources distributed in a plane parallel to the plane of the photomask in such a way that the distance from the photomask to the infrared radiation means is given by the relationship:

$$D = 1.5 \times d$$

wherein:

D is the distance between a plane containing the infrared radiation sources and the photomask; and d is a distance between the center points of two neighboring infrared radiation sources; and maintaining the chamber at low pressure and at the fixed temperature for a fixed duration of time;

stopping the heating of the photomask;

restoring atmospheric pressure in the sealed chamber by injection of a neutral gas; and ascertaining that the temperature of the photomask is about 30°-35° C. before extracting the photomask from the sealed chamber.

10. The method according to claim 9 further comprising verifying the positioning of the photomask by means of at least three remote ultrasonic sensors.

* * * * *